United States Patent [19]

Teszner

[11] 3,814,995

[45] June 4, 1974

[54] FIELD-EFFECT GRIDISTOR-TYPE TRANSISTOR STRUCTURE

[76] Inventor: Stanislas Teszner, 49, rue de la Tour, Paris, France 75016

[22] Filed: Mar. 12, 1973

[21] Appl. No.: 340,013

[30] Foreign Application Priority Data

Mar. 10, 1972 France .............................. 72.08446
Nov. 9, 1972 France .............................. 72.39748

[52] U.S. Cl. ................................357/22, 357/55
[51] Int. Cl. ............................................ H01c 7/14
[58] Field of Search ......................... 317/235, 21, 46

[56] References Cited

UNITED STATES PATENTS

| | | | |
|---|---|---|---|
| 3,407,342 | 10/1968 | Teszner | 317/235 |
| 3,413,531 | 11/1968 | Leith | 317/235 |
| 3,497,777 | 2/1970 | Teszner | 317/235 |

*Primary Examiner*—Rudolph V. Rolinec
*Assistant Examiner*—E. Wojciechowicz

[57] ABSTRACT

A field-effect semiconductor structure of the gridistor type comprises a wafer of semiconductor material of one type of conductivity having an upper and a lower surfaces, a drain electrode on said lower surface of the wafer, a gate of semiconductor material of the opposite type of conductivity embedded in the wafer, a plurality of conductive channels perpendicular to and surrounded by said gate, said gate being covered with an epitaxiably deposited layer of the said type of conductivity. A frame surrounding the gate and frame bars dividing the gate into compartments are embedded in the wafer and in ohmic contact with the gate. In order not to extend the gate thickness during the process of heightening the frame from its embedded level up to the upper surface, a pit is sunk opposite the frame and the gate contact is taken on the frame at the bottom of the pit. The gate, frame and frame bars have their middle part formed in a low-resistivity semiconductor layer and their lateral parts formed respectively in two high-resistivity semiconductor layers adjacent to and on both sides of the low resistivity layer.

4 Claims, 11 Drawing Figures

(DIFFUSED GATE)

(DIFFUSED GATE)

DIFFUSED GATE
ENLARGED VIEW (IMPLANTED GATE)
ENLARGED VIEW

FIELD-EFFECT GRIDISTOR-TYPE TRANSISTOR STRUCTURE

This invention relates to a field-effect gridistor-type transistor structure.

The structure of field-effect semiconductor devices called "gridistors" comprising a flat embedded gate through which a number of vertical conductive channels extend has been described inter alia in U.S. Pat. Nos. 3,274,461 issued Sept. 20, 1966 and 3,497,777 issued Feb. 24, 1970 in the name of the present applicant and, more recently, in U.S. Pat. No. 3,767,982 issued Oct. 23, 1973 in the names of Stanislas TESZNER, Daniel P. LECROSNIER and Gerard P. PELOUS.

The structure comprises a semiconducting substrate having a given type of conductivity, in which a gate made of semiconducting material having the opposite type of conductivity is embedded, both sides of the substrate being provided with heavily-doped layers of the given semiconductor type forming source and drain contacts. A plurality of conductive channels of the given type of conductivity are formed through the gate. The gate is usually surrounded by a frame with or without transverse bars, said frame and frame transverse bars having an ohmic contact with the gate and being intended to divide the structure into compartments and to allow the gate to take a substantially equipotential bias at the operating frequency. The frame and the frame bars are embedded in the substrate; they must be hightened up to the level of a large face of the substrate in order to receive the gate electrode and also to prevent any current path from the source to the drain which would by-pass the channels.

The general object of the invention is to increase the figure of merit of the field-effect transistor defined as the ratio of the transconductance to the sum of the gate-source and gate-drain capacitances. The increase of the figure of merit is performed by both increasing the transconductance per unit area of the structure and decreasing the gate-source and gate-drain stray capacitances.

At the same time, the ratio of the transconductance to the drain current which defines the energetic efficiency of a gridistor operating as an amplifier or an oscillator is improved. The decrease of the gate-source and gate-drain stray capacitances results in an increase of the input and output impedances and correlatively of the voltage and power gain.

Another object of the invention is to straighten the crosssection of the channels extending through the gate in order to increase the drain differential resistance which contributes to the increase of the output impedance of the device.

The increase of the transconductance per unit area of the structure is obtained by improving the so-called quality factor $\eta$ defined as the ratio of the cross-sectional area of the channels going through the gate to the total area of the gate and by giving the rectifying junction between the channels and the gate an abrupt waveform which results in decreasing the pinch-off voltage of the channels for a given geometry and resistivity of the same. The sraightening of the cross-section of the channels contributes to the same result.

The decrease of the stray capacitances is simultaneously obtained by the improvement of the quality factor $\eta$ since the surfaces giving rise to the stray capacitances decrease as the quality factor increases. The stray capacitance reduction is further completed by decreasing the specific gate-source and gatedrain capacitances per unit area. This is implemented by an adequate reduction of the impurity concentration (consequently by a resistivity increase) of the semiconductor layers on the source side and drain side of the channels with respect to the semiconductor layer near the middle part of the channels. As it will be seen, the resistivity increase is not symmetrical with respect to the middle part of the channels; it is larger on the drain side than on the source side. Further to the stray capacitance reduction, the layer resistivity gradation insures the straightening of the channels.

When the gridistor comprises an epitaxial layer deposited at the end of the fabrication process, the heightening of the frame and the frame bars from its embedded level up to the upper surface of this epitaxial layer is obtained, in the prior art, by diffusion in the gaseous phase of a high concentration impurity of the same conductivity type as the gate body. This diffusion creates a superficial frame and superficial frame bars in ohmic contact with respectively the embedded frame and the embedded frame bars. During the diffusion, the impurity atoms in the gate body are redistributed by exodiffusion and invade the epitaxial layer which increases the volume and particularly the thickness of the gate body. For taking account of this gate thickness increase, it is necessary to increase the thickness of the epitaxial layer which lengthens the duration of the diffusion operation. This in turn further increases the thickness of the gate body. This cumulative process prevents the gate body thickness and the epitaxial layer thickness to be given a substantially small value, which deteriorates the fineness of the structure and its capacity to operate in the microwave range.

In U.S. Pat. No. 3,497,777 above referred to, the increase of the gate body thickness during the diffusion operation of the superficial frame and frame bars was prevented at least to some extent by decreasing the thickness of the epitaxial layer in the portion of the same above the internal frame and internal frame bars by an etching operation. But the pit thus sunk did not reach the internal frame and frame bars and the superficial frame and frame bars has to be diffused, although during a reduced time.

As will be seen the invention prevents this degradation by sinking pits reaching the frame and frame bars in the upper epitaxial layer. Thus the superficial frame and frame bars have no longer to be diffused. Accordingly, the principal ground of the gate degradation is suppressed. Further, the wafer comprises layers of graduated resistivities and the gate, the frame and the frame bars are embedded in a particular region of the semiconductor wafer for reasons which will be explained later on.

The invention wll now be disclosed in details in relation with the accompanying drawings in which.

Figure 8A:
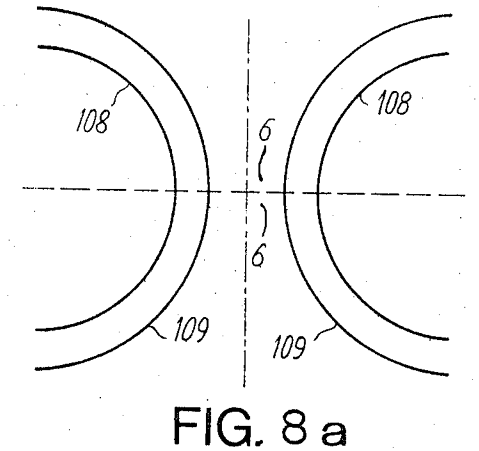
Figure 8B:
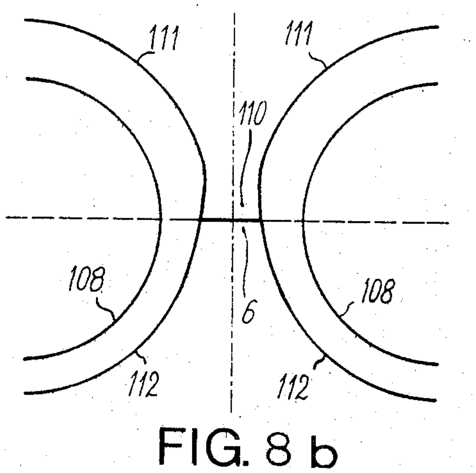
Figure 9:
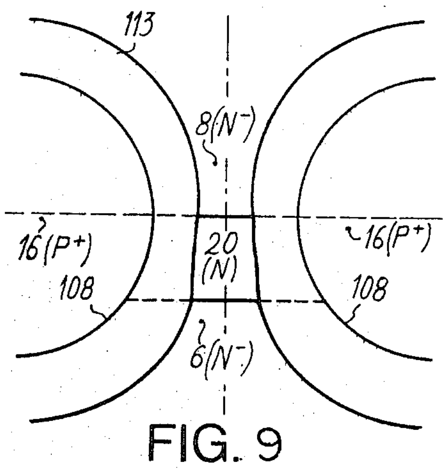

FIGS. 8*a*, 8*b* and 9*c* are expanatory figures showing the layer stratification in the prior art gridistors; and FIG. 9 is an explanatory figure showing the layer stratification in the gridistors according to the invention.

Figure 1:
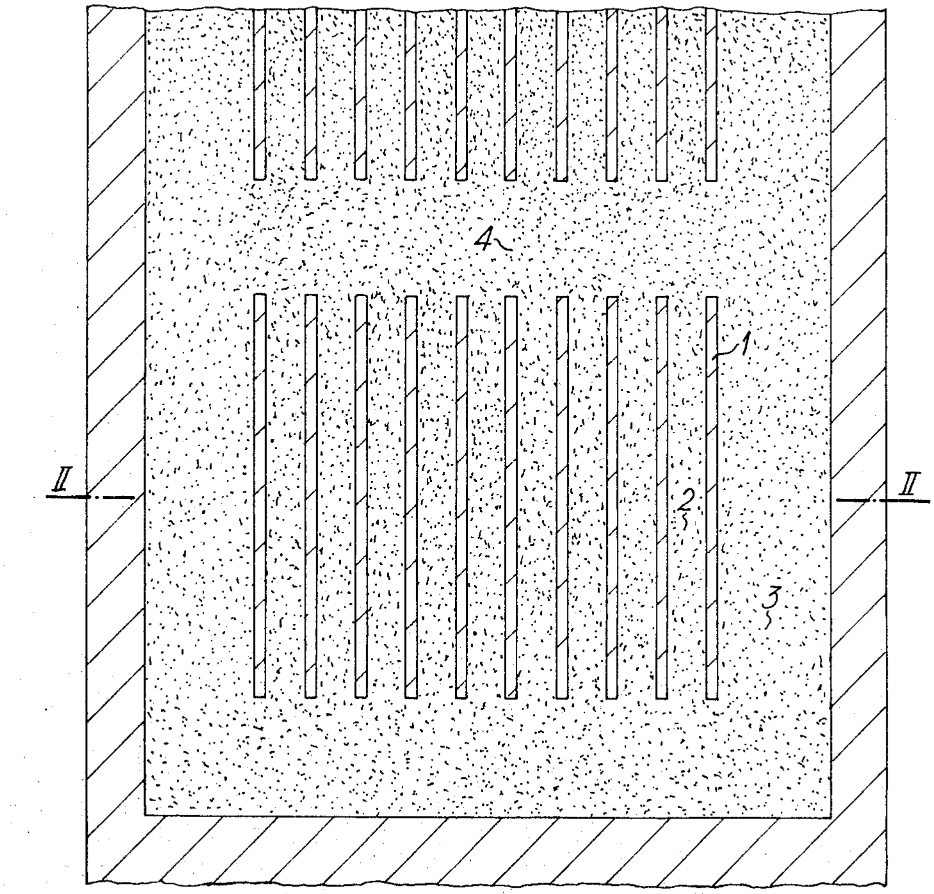
FIG. 1 PRIOR ART
FIGS. 1 and 2 represent respectively a longitudinal cross-sectional view and a transverse cross-sectional view of a prior art gridistor, the cross-section planes being respectively designated by II—II in FIG. 1 and I—I in FIG. 2.
Figure 2:
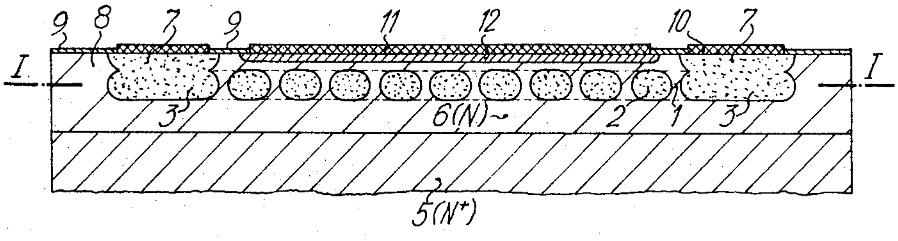
FIG. 2 PRIOR ART

Referring now to FIGS. 1 and 2 which represent a prior art gridistor structure shown in cross-section along respectively cross-sectional planes I—I of FIG. 2 and II—II of FIG. 1, this structure comprises several compartments. FIG. 1 shows one of these compartments and the beginning of another at the upper part of the figure. Each compartment comprises ten conductive channels in N-type silicon, which pass through a gate 2 in heavily doped P-type silicon, the gate 2 being surrounded by a frame 3 also in heavily doped P-type silicon which is in ohmic gate with the gate and includes transverses bars 4 which define the compartments of the structure. As already said in the introductory part, the function of the frame and frame bars is to allow an equipotential bias of the gate.

The structure of FIG. 2 also comprises a highly doped N-type silicon layer 5 and a N-type silicon layer 6 usually deposited by epitaxy. An oxide mask is deposited on to layer 6 and, through the mask, are simultaneously prediffused gate 2, frame 3 and bars 4. The oxide mask which is located in the plane I—I is then removed and a second epitaxial layer 8' is deposited. The structure of the diffused gate is only slightly affected since, as we have already seen, this last-mentioned deposit is made at a relatively low temperature (silane or di- or trichlorosilane epitaxy at an operating temperature of the order of 1,000° to 1,050°C) and the operation is very short owing to the thinness of the required deposit.

Figure 3:
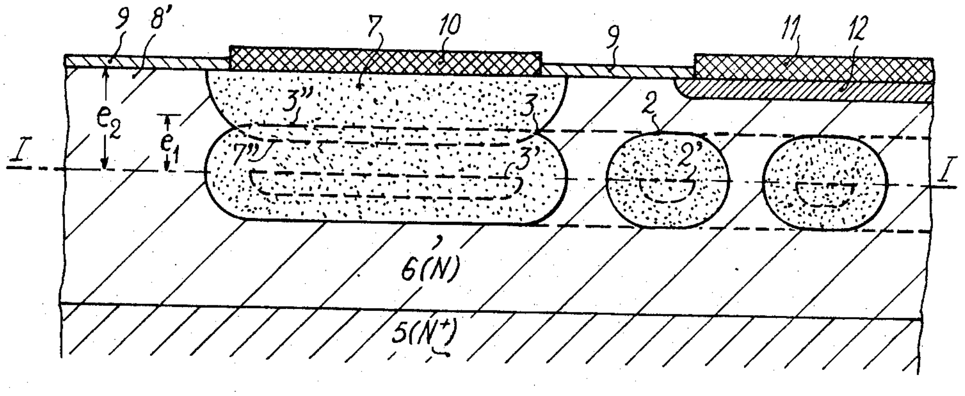
FIG.3 PRIOR ART
FIG. 3 is an enlarged view of a part of FIG. 2.

The case is quite different during the subsequent operation, consisting in the diffusion of the wall of junction 7, which should be in intimate contact with frame 3 and of the walls corresponding to the bars, through an oxide mask 9 made for this purpose. The diffusion is usually performed at the highest possible concentration (e.g., of the order of $10^{20}$ boron atoms per $cm^3$) in order simultaneously to decrease the resistance of the frame and frame bars and the required duration of diffusion. This duration is still appreciable, however, all the more because, in order to obtain an intimate contact, the diffused cross-sections of wall 7 and frame 3 must interpenetrate as shown by the broken lines 7'' and 3'' on the large-scale FIG. 3. FIG. 3, which shows the left hand part of FIG. 2 on a large scale, shows the effect of the diffusion on the volume of the gate body, which affects the structure both by degrading the fineness of its shape and by thickening the final epitaxial layer 8' which has to be deposited.

In order to show the resulting increase in the volume of the gate body, the broken lines 2' and 3' in FIG. 3 shows the outlines of the prediffused volumes, which may be compared with the outlines 2 and 3 of the final volumes. The increase in the thickness of the epitaxial layer 8' may be appreciated by comparing, likewise on FIG. 3, the thickness $e_2$ which is actually necessary with the thickness $e_1$ which would have been practically sufficient if the exodiffusion had not occured.

In the remaining of the formation process, the volumes and thicknesses in question are only slightly modified, since the final operations consist in the diffusion of a high dose of N-type material (e.g., phosphorus) forming the contact region 9 of the source electrode, and the deposition, on to the wall 7 and on to this previously diffused N-type region 12, of metal layers 10 and 11 providing gate and source contacts respectively (the drain contact on the heavily-doped base 5 is not shown), and only relatively moderate temperatures (not exceeding 900°C) are required. Consequently, in order to prevent the aforementioned degradation of the structure, it is mainly necessary to reduce to a minimum the operation of diffusing the wall 7.

Figure 6:
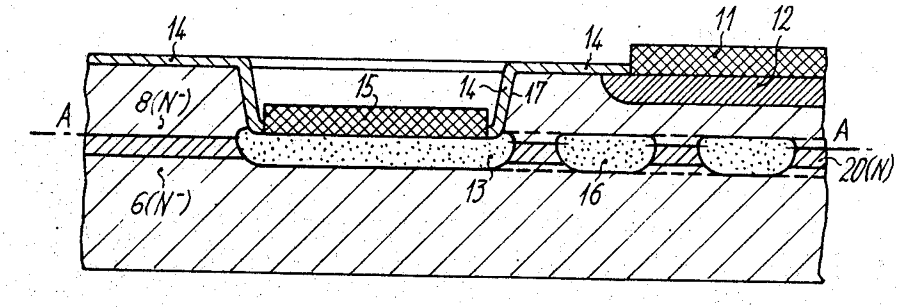
FIG. 6 is a transverse corss-sectional view of a gridistor according to the invention, manufactured by the diffusion technique.

A structure according to the invention is shown in FIG. 6. If FIG. 6 is compared to FIG. 3, it is shown first that onto the heavily doped N-type base 5, two layers are formed epitaxially, the N-type layer 6 and the N-type layer 20. It is on layer 20 and no longer on layer 6 that the oxide mask is formed in order to selectively diffuse the gate and the frame. Consequently, there are finally three layers on base 5, $N^-$-type layer 6, N-type layer 20 and $N^-$-type layer 8. There is shown also that a pit 17 is hollowed above frame 13 and above the bars (not shown in the drawing) until it penetrates into the body of frame 13 and the bars. The bottom of the pit is provided with a contact layer 15 at the same time as the source contact layer 11 and the drain contact layer (not shown) are formed respectively on the previously diffused N-type region 12 and the heavily doped base 5.

Preferably, pit 17 is hollowed or bored by chemical etching through the apertures of a photo-sensitive varnish mask or by ionic machining through a metal mask. Subsequently, the mask used for forming the pit is replaced by a contact mask 14 made of pyrolytic silica or pyrohydrolytic alumina, produced at a temperature below 900°C, consequently without extensively affecting the gate body and used to position the gate and source contact layers.

A further comparison between FIGS. 6 and 3 shows how the fineness of the structure is improved. Frame 3 and gate body 2 are considerably reduced to 13 and 16 respectively. The quality factor $\eta$ defined in the introductory part is raised from 0.2 to 0.3 and the thickness of the gate is reduced by more than 50 percent by eliminating that part of the grid comprising highly divergent channels. Consequently the epitaxial layer 8' is likewise reduced to 8.

Figure 7:
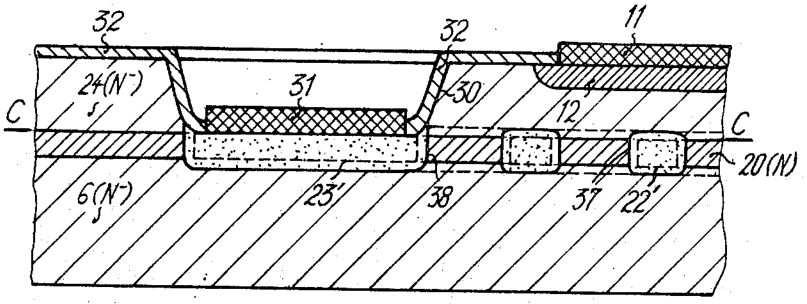
FIG. 7 is a transverses cross-sectional view of a gridistor according to the invention, manufactured by the ion implantation and diffusion techniques.

Still larger values of the quality factor $\eta$ can be obtained, using an ion implantation technique combined with an epitaxy technique. FIG. 7 represents transverse cross-sectional views of a gridistor formed according to the invention by the said techniques.

Figure 4:
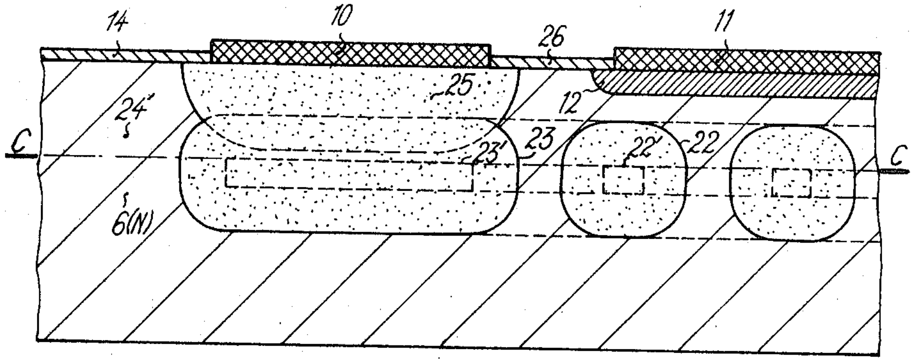
FIG.4 PRIOR ART
FIG. 4 represents a transverse cross-sectional view of a gridistor of the prior art manufactured by the ion implantation technique.

In FIG. 4, the process is as follows: as before, the substrate comprises a heavily doped silicon base (not shown in the drawing) having thereon an N-type epitaxial layer 6, in which the N-type gate body denoted by the small dotted rectangles 22', a frame represented by a long rectangle 23' and bars (not shown) are formed by ion (boron ion) implantation through apertures in a metal mask provided for the purpose. After removal of the mask and subsequent heat treatment, the substrate is completed by epitaxial deposition of an N-type layer 24′ on the plane C—C performed at the lowest possible temperature as previously specified. After this operation, the junction wall 25 with the frame 23′ is formed by diffusion; during this operation the boron ions forming the gate body 22′ and the frame 23′ are redistributed, as in the conventional method described earlier (FIG. 3), resulting in diffusion from the entire surface of 22′ and 23′. The result is a structure shown in continuous lines in FIG. 4, with wall 25, frame 23 and gate body 22. Finally, the gate contact 10, the source contact 11 (deposited on the $N^+$-type diffusion layer 12) and the drain contact (not shown) are formed, the two first through the oxide mask 14.

A comparison between the structure in FIG. 4 and the structure in FIG. 3 shows only a slight increase in fineness in spite of the use of the ion implantation technique. The diffusion of the junction walls to the frame practically cancel out the advantages of this method, which is due to the fact that implantation is practically unidirectional and perpendicular to the wafer surface and consists in a very small lateral extension of the gate body and the frame, which results in a maximum quality factor and very abrupt gate-channel PN junction and consequently in a very small channel striction voltage and maximum transconductance, in the case of a channel having a given structure and resistivity.

The structure according to the invention can be modified to obviate this disadvantage and attain the aforementioned advantages. Two embodiments thereof are shown in FIG. 7.

FIG. 8 shows an alternative embodiment of the structure in FIG. 6. As in FIG. 6, an epitaxial N-type layer 20 is deposited on to layer 6, then an oxide mask is formed on the surface of layer 20. The diffusion of the junction wall 25 to the frame 23′, carried out in the structure in FIG. 4, is replaced by a pit 30 formed above frame 38 and also above the bars (not shown) which bound the compartiments. The pit is subsequently covered with a gate contact metal layer 31 deposited through an aperture in an oxide mask 32 at the same time as the source contact layer 11 (on an $N^+$ layer 12 diffused at a relatively low temperature) and the drain contact layer (not shown). Before this final operation, boron ions forming the gate body 22′, the frame 23′ and the bars (not shown) are implanted in layers 6 and 20 as in the process of FIG. 4 and the final epitaxial layer 24 is deposited. During the latter operation, the gate body and the frame slightly expand to the shapes 37, 38 respectively, shown in continuous lines.

The resulting structure has a quality factor approaching 0.5, owing to the very refined shape and to the very abrupt gate-channel PN junction, with the result that the channel for a given striction voltage can be wider. Furthermore, the thickness of the gate and consequently the length of the channels is greatly reduced (by approximately 70 percent) and the channel cross-sectional shape is considerably improved. Finally, the thickness of the final epitaxial layer 24 is substantially less than the thickness of the corresponding layer 24′ in FIG. 4.

The advantages of the layer stratification and the resistivity distribution of these layers in the gate region will now be explained.

Figure 5:
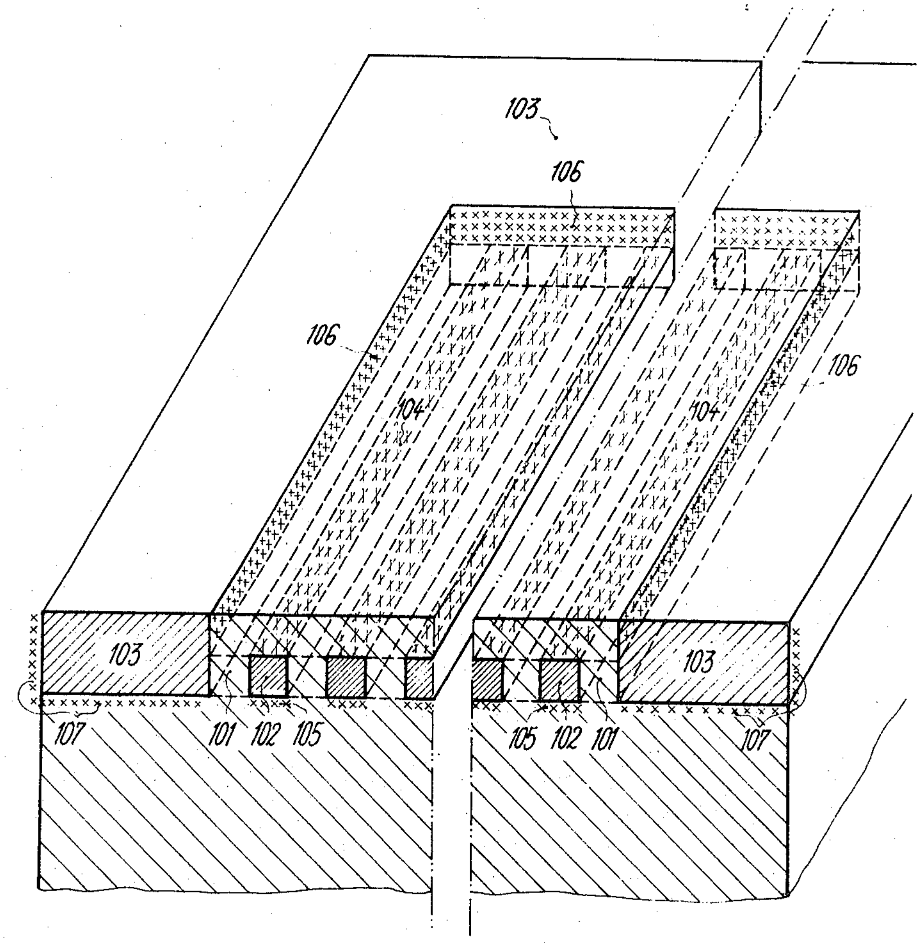
FIG. 5 represents in cross-section and in perspective an idealized gridistor showing the surfaces giving rise to stray capacitance.

The structure in FIG. 5 is similar to that of FIGS. 1 and 2 but it is idealized. The cross-sections of the bars 102 of the gate and of the channels 101 are assumed to be square and identical to each other. Even in such as idealized structure, the surfaces giving rize to stray capacitances form most of the total area, approximately 50 percent of the total area. This is easily seen in FIG. 5, where the surfaces in question are cross-hatched. Parts 104 and 105 correspond to the top and bottom surfaces of the gate bars; part 106 corresponds to the vertical surfaces of the pit formed by frame 103, and part 107 corresponds to the outer vertical surface and the inner horizontal surface of the frame. It is particularly important, therefore, to attempt to reduce the stray capacitance.

In FIG. 5, the surfaces of the stray capacitances 104, 105, 106 and 107 are nearly all either above or below the gate bars 102. This leads to the idea of greatly reducing the value of these capacitances by reducing the specific capacitance on which they depend. This reduction is obtained by increasing the resistivity of the layers where space charges corresponding to these capacitances develop, since it is known that in a semiconducting medium the thickness of the space charge is inversely proportional to the square root of the concentration of charge carriers in this semiconducting medium. In other words, for constant charge carrier mobility, the resistivity of the semiconductor is inversely proportional to the said concentration.

In FIGS. 6 and 7, the substrate comprises, as already said, a $N^+$-type base 5 and two epitaxially deposited layers, $N^-$-type layer 6 and N-type layer 20, the meaning of $N^-$ and N being that the resistivity of layer 6 is less than that of layer 20. The last layer 8 is epitaxially deposited after the formation of the gate, the frame and the frame bars; it has a resistivity higher than that of layer 20. For example, silicon layer 20 will have a resistivity of 0.6 ohm.cm with a concentration $N \approx 10^{16}$ atoms/cm³, and layers 6 and 8 surrounding it will have a resistivity of 3 ohm.cm with a concentration $N \approx 1.3 \times 10^{15}$ atoms/cm³ (note that the concentration varies inversely and more quickly than the resistivity, since in this region of values, the mobility of the charge carriers varies quite appreciably as an inverse function of the concentration). Consequently, the stray capacitance will be reduced in the ratio $\sqrt{10/1.3}$, i.e., to approximately 36 percent of the corresponding value in FIG. 2. Consequently, the total capacitance will be reduced by about 45 percent.

This reduction in capacitance effects the gridistor performance by practically doubling the product $F_M$ = gain × amplifier passband and the quantity $f_{max}$ = maximum oscillation frequency. Of course, the increase in the resistivity of the layers adjacent to the gate on the drain side and on the source side will automatically lead to an increase in the corresponding series stray resistances. These stray resistances, however, are multiplied by the square of the corresponding capacitances when they occur in the real part of the input and output conductance of the system. Thus, it can be seen, therefore, that their effect on these conductances will be very slight; furthermore, the gridistor is constructed so that the resistivity of the adjacent layers can be somewhat increased, since the channels are connected to the source and drain across the entire, or practically the entire, cross-section of the structure.

To clarify ideas by a numerical example, assuming that the thickness and length of the channel and the thickness and height of the gate bars is 1 μm, and the silicon substrate comprising the three layers has the resistivities specified above, the merit figure $F_M$ which can be obtained is of the order of 20 GHz, and the maximum frequency $f_{max}$ is of the order of 50 GHz.

It is already known to change a channel having a divergent cross-section into a channel having a constant cross-section along a part of its length. U.S. Pat. No. 3,497,777 referred to above discloses a system for providing a channel having a doubly divergent cross-section by progressively varying the resistivity of the substrate but by operating on only half the channel length on the source side. In the present invention, the same feature is extended to the entire length of the channel, by surrounding the central parts by layers having prior resistivity and, if required, by obtaining a finer cross-section by dividing the central part into layers.

Figure 8C:
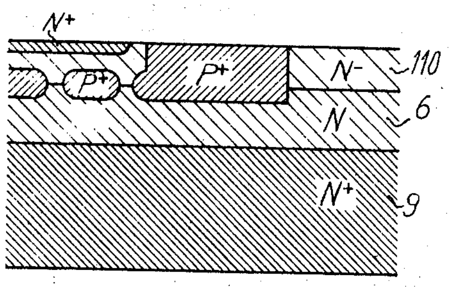

The effect of these improvements will be more clearly understood from FIGS. 8*a*, 8*b*, 8*c*.

FIG. 8*a* shows the cross-section of a semi-circular channel divergent on both sides, in a homogeneous substrate 6. The semicircle 108 represents the cross-section formed by diffusion, whereas the semicircle 109 shows the cross-section of the channel bounded by the space charge due to the PN junction potential. Clearly the charge if of uniform thickness along the cross-section.

The case is quite different in FIGS. 8*b* and 8*c*. The structure 8*c* is characterized by a substrate comprising a N-type layer 6 on which a layer 110 ($N^-$) has been epitaxially deposited and has a substantially higher resistivity (2.5 times in the present case). As before, semicircle 108 represents the cross-section formed by diffusion. On the other hand, the cross-section bounded by the space charge due to the PN junction potential is quite different; since the two layers have different resistivities, the space charge is considerably (approximately 1.6 to 1.7 times) greater in layer 110 than in layer 6 (see lines 111 and 112 respectively). Consequently, the actual operative cross-section allowing for the development of the space charges becomes substantially rectilinear and divergent on only one side, along an appreciable portion of the channel length. If the optimum divergence is taken at the ratio of 1.5 between the output aperture and the input aperture of the cross-section bounded by the space charge due to the PN junction, it can be seen that in the present case the useful length of the channel will be about 30 percent of the total length.

On the other hand FIG. 9, corresponding to the structure of FIG. 6, shows an appreciably greater improvement of the cross-section. In order to facilitate a comparison between FIGS. 8*b* and 9, the semi-circular diffused cross-section 108 is here assumed to have the same ratio "length/aperture" = 2 whereas in FIG. 6 the ratio is equal to unit. Accordingly, the cross-section bounded by the space charge due to the junction comprises the following three parts: a central part corresponding to layer 20 and having a resistivity of 1 ohm.cm, a part on the source side corresponding to layer 8 having a resistivity of 2.5 ohm.cm and a part on the drain side, corresponding to layer 6 having a resistivity of 3 ohm.cm. In the resulting cross-section, obtained in the aforementioned manner and by connecting the space charges in the three superposed layers, the parasitic portion of the channel length is reduced to about 50 percent. Furthermore, the useful part of the length increases to some extent with the bias of the gate and drain with respect to the source. Consequently, the differential resistance of the drain is at least 4 times as great as when the substrate has an uniform resistivity, and has nearly double the resistance obtained in the structure in FIG. 8*c*.

It is possible to replace each of layers 6 and 8 by two adjacent layers, the resistivity decreasing from the drain side to the middle plane of the channels then increasing from said plane towards the source side.

Silicon may be replaced by other semi-conducting substances such as germanium or compounds in groups III–V more particularly gallium arsenide.

What I claim is:

1. A field-effect semiconductor structure of the gridistor type comprising a wafer of semiconductor material of a given type of conductivity having an upper and a lower surface and a first relatively high resistivity semiconductor layer and a second relatively low resistivity semiconductor layer, a drain electrode on said lower surface of the wafer, a gate of semiconductor material of the opposite type of conductivity, having its central region substantially embedded in the second semiconductor layer of the wafer, a plurality of conductive channels of said given type of conductivity perpendicular to and surrounded by said gate, said gate defining between itself and the upper surface of the wafer a third relatively high resistivity semiconductor layer of the said given type of conductivity, a frame and frame bars of the opposite type of conductivity, having their central region substantially embedded in the second semiconductor layer of the wafer and in ohmic contact with the gate, said frame surrounding the gate and said frame bars dividing the structure into compartments, a pit sunk in said third semiconductor layer and down to said frame, a source electrode on said upper surface and a gate electrode in the bottom of said pit and in ohmic contact with said frame.

2. A field-effect semiconductor structure of the gridistor type comprising a wafer of semiconductor material of a given type of conductivity having an upper and a lower surface and a first relatively high resistivity semiconductor layer and a second relatively low resistivity semiconductor layer, a drain electrode on said lower surface of the wafer, a gate of semiconductor material of the opposite type of conductivity, having its central region substantially embedded in the second semiconductor layer of the wafer, a plurality of conductive channels of said given type of conductivity perpendicular to and surrounded by said gate, said gate defining between itself and the upper surfaces of the wafer a third relatively high resistivity semiconductor layer of the said given type of conductivity, a frame and frame bars of the opposite type of conductivity, having their central region substantially embedded in the second semiconductor layer of the wafer and in ohmic contact with the gate, said frame surrounding the gate and said frame bars dividing the structure into compartments, a pit sunk in said third semiconductor layer opposite and down to said frame and said frame bars, a source bottom of said pit and in ohmic contact with said frame and said frame bars.

3. A field-effect semiconductor structure of the gridistor type comprising a wafer of semiconductor material of a given type of conductivity having an upper and a lower surface and a first relatively high resistivity semiconductor layer and a second relatively low resistivity semiconductor layer, a drain electrode on said lower surface of the wafer, a diffused gate of semiconductor material of the opposite type of conductivity, having its central region substantially embedded in the second semiconductor layer of the wafer, a plurality of conductive channels of said given type of conductivity perpendicular to and surrounded by said gate, a frame and frame bars of the opposite type of conductivity, having their central region substantially embedded in the second semiconductor layer of the wafer and in ohmic contact with the gate, said frame surrounding the gate and said frame bars dividing the structure into compartments, a third relatively high semiconductor layer of the said given type of conductivity epitaxially deposited on to said second relatively low resistivity semiconductor layer, a pit sunk in said third semiconductor layer opposite and down to said frame and said frame bars, a source electrode on said upper surface and a gate electrode in the bottom of said pit and in ohmic contact with said frame and said frame bars.

4. A field-effect semiconductor structure of the gridistor type comprising a wafer of semiconductor material of a given type of conductivity having an upper and a lower surface and a first relatively high resistivity semiconductor layer and a second relatively low resistivity semiconductor layer, a drain electrode on said lower surface of the wafer, an implanted gate of semiconductor material of the opposite type of conductivity having its central region substantially embedded in the second semiconductor layer of the wafer, a plurality of conductive channels of said given type of conductivity perpendicular to and surrounded by said gate, a frame and frame bars of the opposeite of the opposite type of conductivity, having their central region substantially embedded in the second semiconductor layer of the wafer and in ohmic contact with the gate, said frame surrounding the gate and said frame bars dividing the structure into compartments, a third relatively high semiconductor layer of the said given type of conductivity epitaxially deposited on to said second relatively low resistivity semiconductor layer, a pit sunk in said third semiconductor layer opposite and down to said frame and said frame bars, a source electrode on said upper surface and a gate electrode in the bottom of said pit and in ohmic contact with said frame and said frame bars.

* * * * *